United States Patent [19]

Miyazaki et al.

[11] Patent Number: 5,299,584
[45] Date of Patent: Apr. 5, 1994

[54] CLEANING DEVICE

[75] Inventors: Takanori Miyazaki; Sinitirou Izumi, both of Kumamoto, Japan

[73] Assignees: Tokyo Electron Limited, Tokyo; Tokyo Electron Saga Limited, Tosu, both of Japan

[21] Appl. No.: 872,360

[22] Filed: Apr. 23, 1992

[30] Foreign Application Priority Data

Apr. 23, 1991 [JP] Japan ................. 3-117819

[51] Int. Cl.[5] .............................................. B08B 3/04
[52] U.S. Cl. ................................. 134/56 R; 134/99.1; 134/111; 134/902; 454/187
[58] Field of Search ............... 134/902, 56 R, 99.1, 134/111; 454/57, 58, 59, 187

[56] References Cited

U.S. PATENT DOCUMENTS

| 3,893,869 | 7/1975 | Mayer et al. | 134/902 X |
|---|---|---|---|
| 4,098,174 | 7/1978 | Landy | 454/57 |
| 4,493,333 | 1/1985 | Layton | 134/902 X |
| 4,520,834 | 6/1985 | DiCicco | 134/902 X |
| 4,694,527 | 9/1987 | Yoshizawa | 134/902 X |
| 4,741,257 | 5/1988 | Wiggin et al. | 454/59 X |
| 4,838,979 | 6/1989 | Nishida et al. | 134/902 X |
| 4,955,402 | 9/1990 | Miranda | 134/111 X |
| 4,976,815 | 12/1990 | Hiratsuka et al. | 454/187 X |
| 4,987,673 | 1/1991 | Kogura et al. | 454/187 X |
| 5,159,946 | 11/1992 | Seiichiro | 134/902 X |
| 5,191,908 | 3/1993 | Hiroe et al. | 134/902 X |

FOREIGN PATENT DOCUMENTS

| 57-128142 | 8/1982 | Japan . | |
| 60-226130 | 11/1985 | Japan . | |
| 281431 | 12/1987 | Japan | 134/902 X |
| 2126710 | 3/1984 | United Kingdom | 134/902 X |

Primary Examiner—Philip R. Coe
Attorney, Agent, or Firm—Oblon, Spivak, McClelland, Maier & Neustadt

[57] ABSTRACT

A cleaning device comprises at least one cleaning tub containing a cleaning liquid, a chamber housing the cleaning tub, a mechanism for taking an article to be cleaned in/out of the cleaning liquid in the cleaning tub, and a shutter for shutting the inside of the chamber from the outside thereof. The shutter opens when a cleaned material is conveyed in/out of the chamber, thereby passing the cleaned material there through. A clean air supplying unit for forming downflow of clean air around the cleaning tub is provided on the upper portion of the chamber. A exhausting unit for sucking the clean air passing around the cleaning tub and exhausting the air out of the chamber is provided on the lower portion of the chamber.

9 Claims, 7 Drawing Sheets

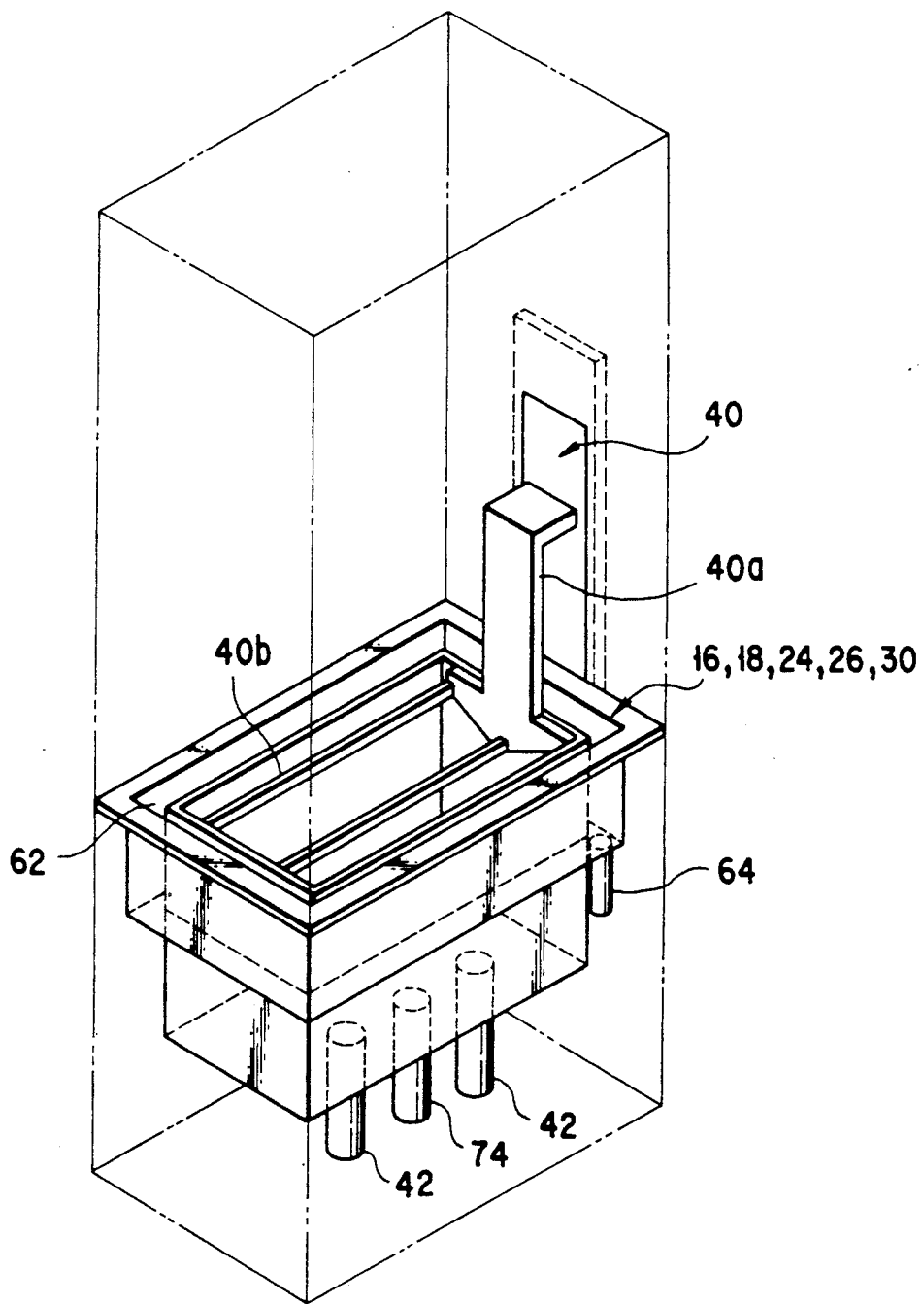
F I G. 2

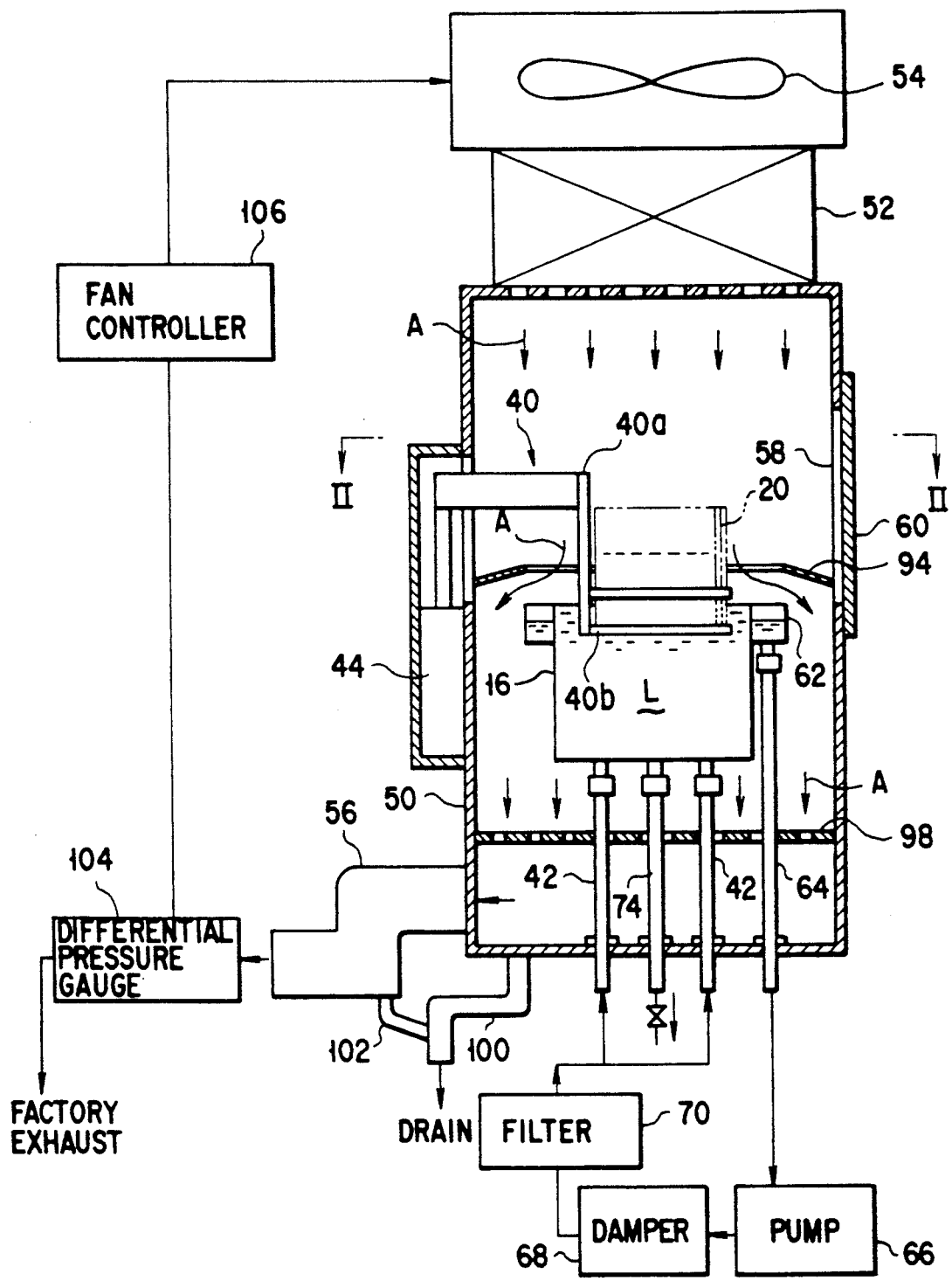
F I G. 3

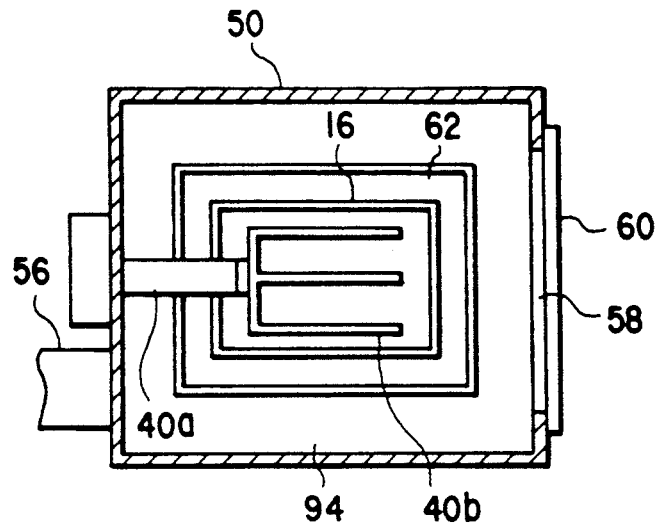
F I G. 4
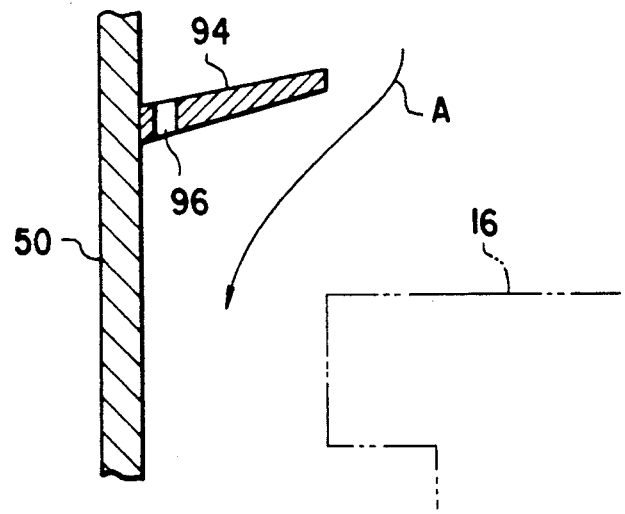
F I G. 5

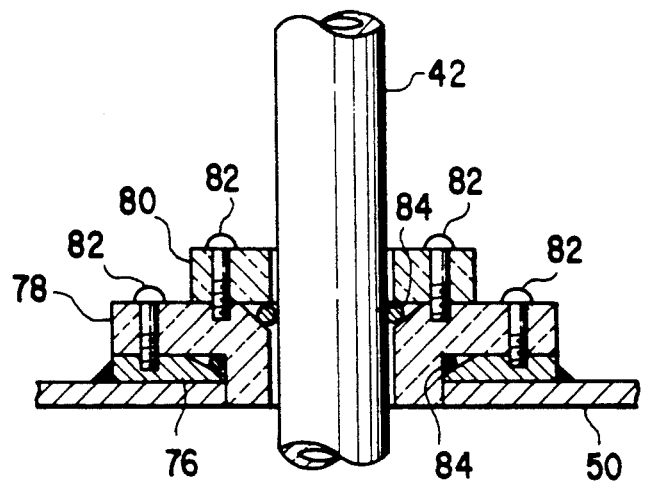
F I G. 6
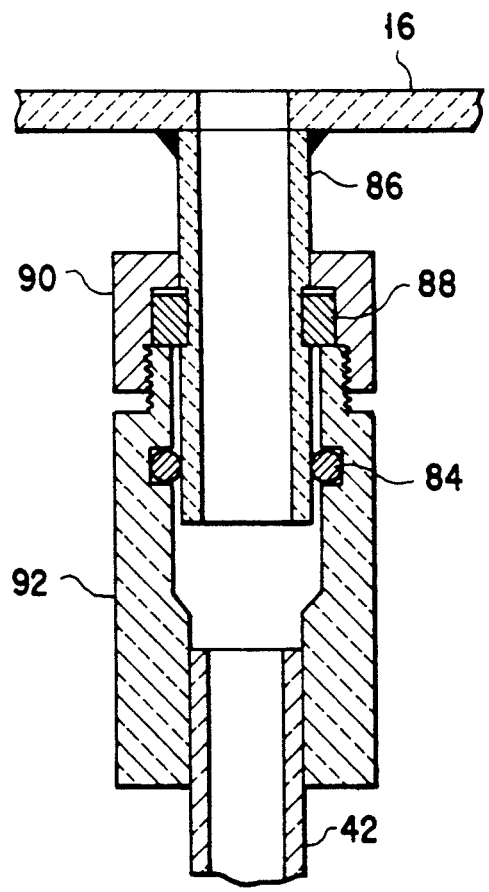
F I G. 7 and drying tub 32

CLEANING DEVICE

BACKGROUND OF THE INVENTION

1. Field of the Invention

This invention relates generally to a cleaning device for cleaning an article to be cleaned, such as a semiconductor wafer in a cleaning tub, and more particularly to such a cleaning device that can always keep clean atmosphere around the cleaning tub.

2. Description of the Related Art

A semiconductor wafer is subjected to various cleaning processes, such as a washing process, an ammonia process, fluoric acid process, and so forth. A device in which such processes are performed has a cleaning tub for a cleaning liquid, such as pure water. In the cleaning liquid contained in the cleaning tub, a semiconductor wafer is dipped and washed.

Some cleaning devices of this type have cleaning tubs in their chambers in order to prevent an cleaning liquids from being scattered on the outside of the chamber and prevent external fine particles, etc. from entering the chamber. A shutter which can be opened/closed is installed at the entrance portion of each chamber so that the semiconductor wafer can be taken in/out.

In this case, however, when the shutter is opened to take the wafer in/out of the chamber, an atmosphere can easily leak out of the chamber. In particular, in the case of using chemicals, as a cleaning liquid, heated at about 80° C., the vapor of the chemicals may cause environmental pollution. Moreover, fine particles are generated from a mechanical portion which carries the semiconductor wafer in the chamber and conveys it in/out of the cleaning tub, and an atmosphere containing the fine particles can easily enter in the chamber. As a result, many foreign objects are adhered on the semiconductor wafer and the yield of semiconductor products is decreased.

SUMMARY OF THE INVENTION

The object of the present invention is to provide a cleaning device which can always keep clean the circumference of a cleaning tub by using downflow of clean air.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

The above object will be achieved by the cleaning device in the present invention which comprises at least one cleaning tub containing a cleaning liquid; a chamber housing the cleaning tub; means for taking an article to be cleaned in/out of the cleaning liquid in the cleaning tub; a shutter for shutting out the chamber from the outside thereof, said shutter being opened when the cleaned material is taken in/out of the chamber, thereby passing the cleaned material there through; clean air supplying means for supplying clean air into the chamber and forming downflow of the clean air around the cleaning tub; and exhausting mean for sucking the clean air passing along the circumference of the cleaning tub and exhausting the air out of the chamber.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a perspective view showing a structure of each cleaning tub;

FIG. 3 is a partially sectional view of the entire structure of the above cleaning device;

FIG. 4 is a sectional view taken along line II-II of FIG. 3;

FIG. 5 is a sectional view of an aligning plate shown in FIG. 3;

FIG. 6 is a sectional view of a sealing structure of the portion where a liquid-supplying tube shown in FIG. 3 penetrates the chamber.

FIG. 7 is a sectional view of a sealing structure of the portion where the cleaning tub is connected with the liquid supplying device, shown in FIG. 3;

DETAILED DESCRIPTION OF THE PREFERRED EMBODIMENTS

Embodiments of the present invention will now be described below with reference to the accompanying drawings.

The embodiments relate to a cleaning device used in a semiconductor wafer producing process.

Figure 1:
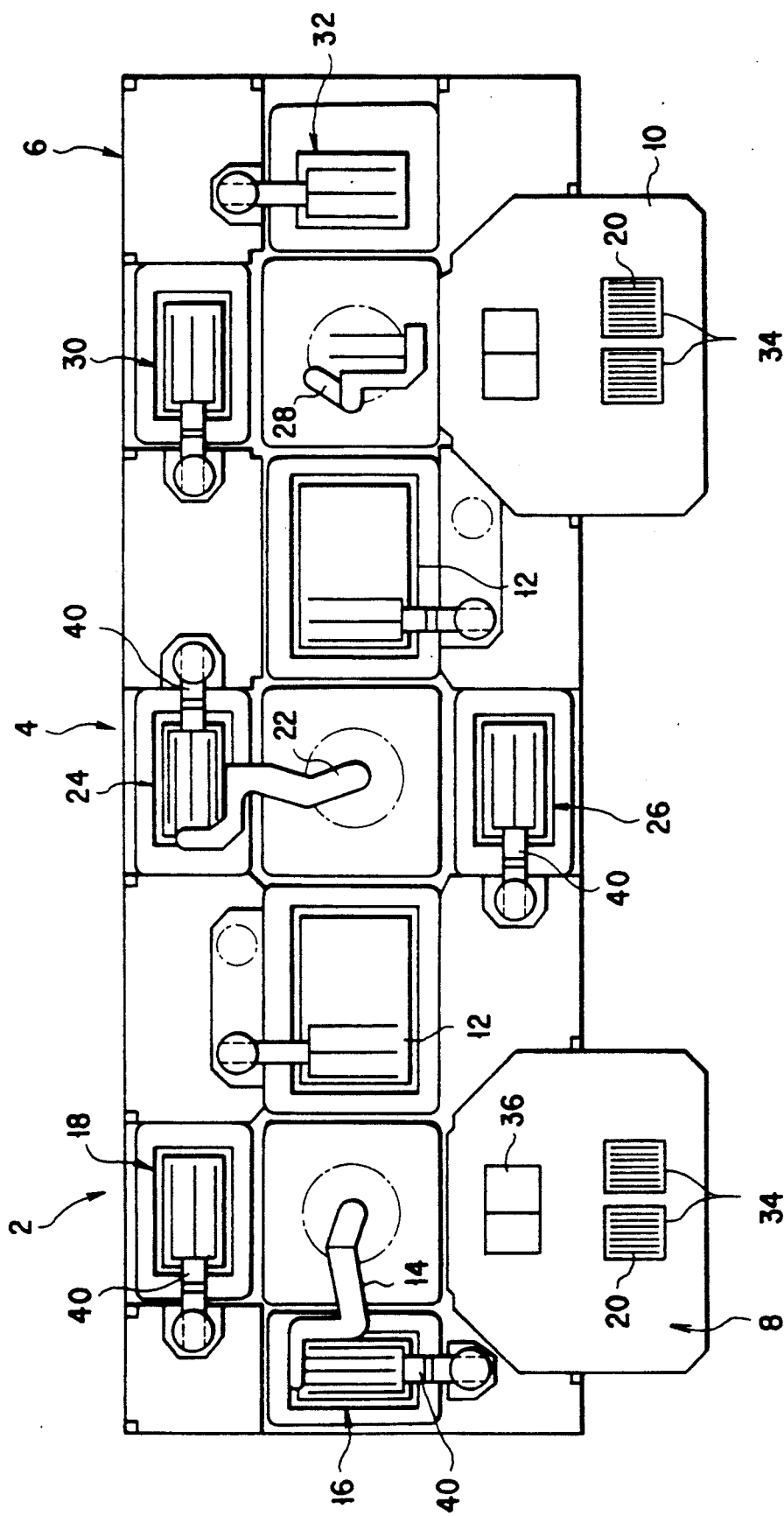
FIG. 1 is a plan view showing the internal structure of a cleaning device according to one embodiment of the present invention.

As shown in FIG. 1, a cleaning device in one embodiment of the present invention consists of three cleaning process units 2, 4, and 6. Loading unit 8 is connected to wafer entrance-side cleaning unit 2, unloading unit 10 to wafer exit-side cleaning unit 6, and further, transfer units 12 for combining three units are arranged between cleaning units 2 and 4 and also between cleaning units 4 and 6 so as to combine these three units.

At the center position of wafer entrance-side cleaning unit 2, a first rotary convey arm 14 for taking out semiconductor wafer 20 is situated. One cleaning tub 18 is positioned in front of loading unit 8, and another cleaning tub 16 is positioned at the left side of rotary convey arm 14, so that both tubs surround rotary convey arm 14.

In the present embodiment, cleaning tub 16 is used for a chemical-process tub in which an ammonia process is performed, and cleaning tub 18 is used for a quick dump rinse (QDR) tub in which a washing process is performed.

In central cleaning unit 4, transfer units 12 are arranged on the left and right sides of a second rotary convey arm 22. Two cleaning tubs 24 and 26 are arranged on the front and rear side of units 12 and arm 22. Cleaning tub 24 is used for a chemical-process tub in which a fluoric acid process is performed, and cleaning tub 26 is used for a washing overflow tub.

In wafer exit-side cleaning unit 6, cleaning tub 30 is situated in front of unloading unit 10 and drying tub 32 is situated on the right side of a third rotary convey arm 28. Both tubs surround the third rotary convey arm positioned at the center of the wafer exit-side cleaning unit 6. In the present embodiment, cleaning tub 30 is used for a washing-final-rinse tub.

In the cleaning device having the above structure, when 25 pieces of semiconductor wafer 20 mounted on each of carriers 34 are taken in loading unit 8, the orientation flat of semiconductor wafer 20 is positioned properly by means of an orientation-flat adjustable-unit (not shown in the drawings) on the loading unit 8, the semiconductor wafer 20 is picked up by means of a pickup mechanism (not shown in the drawings), and the semiconductor wafer 20 is set on pick-up stage 36 by means of a robot arm (not shown in the drawings).

The first rotary convey arm 14 begins to take only semiconductor wafer 20 out from the upper side of loading unit 8, and then only the semiconductor wafer 20 is conveyed to the first cleaning tub 16. After a cleaning process is provided to the wafer 20 in the tub 16, the semiconductor wafer 20 is transferred from the first cleaning tub 16 to the second cleaning tub 18, and then to transfer unit 12, in each of which a cleaning process is performed.

Then, semiconductor wafer 20 is conveyed to a third cleaning tub 24, a fourth cleaning tub 26, and transfer unit 12 by the second rotary convey arm 22 of intermediate process unit 4 and to a fifth cleaning tub 30 and drying tub 32 by the third rotary convey arm 23 of wafer exit-side process unit 6. After wafer 20 is cleaned or dried in each tub, it is conveyed to unloading unit 10, in which the wafer is separated into two carriers 34 and conveyed out.

As shown in FIG. 2, in tubs 18, 26, and 30 for cleaning the wafers with pure water and tubs 16 and 24 for cleaning wafers with chemicals, 50 pieces of semiconductor wafers 20 are housed so as to put them on chemical proof boat 40 at regular intervals, i.e. 1 cm or 6.35 mm. Processing-liquid supplying tube 42 for supplying a cleaning liquid, such as pure water or chemicals, is disposed in the bottom portion of each tub. As wafers arranged on boat 40, a dummy wafer can be situated at least on the side on which a processed surface is exposed or a monitor wafer can be placed at the preferable position. Boat 40, as shown in FIG. 3, is installed in cylinder 44, by which boat 40 can move vertically.

Boat 40 comprises arm 40a and three claws 40b extending perpendicularly from the end portion of ar 40a, as shown in FIG. 2. Wafers 20 are kept upright by three claws 40b. Further, drain 62 is formed along with an outer peripheral surface of each of cleaning tubs 16 and 18 so as to receive a cleaning liquid supplied from process-liquid supplying entrance 42 and overflown from the tub.

Drain 62 is made of side walls higher than the peripheral walls of the cleaning tub, and is large enough to fully receive the overflown cleaning liquid when boat 40 in which semiconductor wafers 20 are fully housed is dipped in the cleaning tub. Further, drain 62 has exhaust port 64. The amount of a cleaning liquid exhaustable every second from this exhaust port 64 is more than the amount of a processing liquid overflown every second from the cleaning tub. In the present embodiment, the amount of the exhausted cleaning liquid is set at more than 20 l/sec.

The first cleaning tub 16 will no be described in greater detail.

As shown in FIG. 3, cleaning liquid L for cleaning an article, e.g. semiconductor wafer 20 is stored in cleaning tub 16, which is housed in chamber 50 in a sealing-up condition. Cleaning tub 16 is made of quartz glass so as not to elute impurities to the cleaning liquid, such as pure water or chemicals. Moreover, cleaning tub 16 is mounted on a supporting stage (not shown) which is set out at the bottom portion of chamber 50, and can be adjusted to the horizontal position by means of an adjusting mechanism (not shown).

As shown in FIGS. 3 and 4, chamber 50 surrounds cleaning tub 16, and at the top portion of chamber 50, ULPA filter 52 for supplying clean air A into chamber 50 and air supply fan 54 are provided, and exhaust air duct 56 having an exhaust air fan (not shown in the drawings) for exhausting clean air A in chamber 50 is connected to the side wall of the bottom portion of chamber 50.

At the upper side wall of chamber 50, semiconductor wafer entrance/exit opening 58 is provided. Opening 58 can be opened/closed by shutter 60 which is vertically slidable by means of a piston, etc. Shutter 60 is adjacent to the outside surface of chamber 50, with a seal made of fluororesin (hereinafter, referred to as "PFA") or polyvinyl chloride (hereinafter, referred to as "PVC") interposed therebetween. Moreover, shutter 60 is made of quartz glass or transparent PVC, and the inside of chamber 50 is kept airtight and can be seen through shutter 60. Shutter 60 has a shutter cleaning mechanism (not shown).

Boat 40 is provided in chamber 50. The boat receives semiconductor wafer 20 conveyed by conveying arm (not shown) and delivers a cleaned semiconductor wafer 20 to the conveying arm when shutter 60 is opened. As previously stated, this boat 40 mainly comprises arm 40a extending from the side wall of chamber 50 into cleaning tub 16, and forked claws 40b mounted in arm 40a. Arm 40a is lowered by means of cylinder 44 connected to arm 40a, so that semiconductor wafer 20 mounted on claw 40b is dipped in cleaning liquid L during a predetermined time period.

Drain 62, which receives cleaning liquid L overflown from a notch formed at the upper end portion of cleaning tub 16, is formed at the upper outer peripheral surface of tub 16, as shown in FIGS. 3 and 4. Cleaning liquid L overflown into drain 62 is exhausted out of chamber 50 through liquid-exhausting pipe 64, and compressed by bellows pump 66. The liquid L becomes free of pulsatile motion by damper 68. Thereafter, foreign material, impurity, etc. in the liquid L is eliminated by means of filter 70. Purified cleaning liquid L returns into cleaning tub 16 through supplying pipes 42. In such a manner, cleaning liquid L is always purified and circulated in cleaning tub 16. Exhaust pipe 74 for exhausting the liquid L and emptying cleaning tub 16, at the time of washing the tub, is installed in cleaning tub 16.

Each of liquid-exhausting pipe 64, liquid-supplying pipe 42, and exhaust pipe 74 is made of PFA, connected to cleaning tub 16, and disposed through the bottom wall of chamber 50. As an example, the sealing structures of liquid-supplying pipe 42, and chamber 50 and cleaning tub 16 will be described.

In the sealing structure for a through portion of chamber 50, as shown in FIG. 6, circular body 76 made of PVC is welded in the through hole portion of the bottom wall of chamber 50 into which liquid-supplying pipe 42 is penetrated. Each of rings 78 and 80 is fixed to circular body 76 by screw 82. In the inside of ring 78, a tubular portion is formed so as to fill up a gap formed between liquid-supplying pipe 42 and chamber 50, and O-rings 84 are provided respectively between ring 78 and circular body 76 and also between ring 78 and liquid-supplying pipe 42. The through portion is kept fluid-tight by O-ring 84 tightened by screw 82. Therefore, if the liquid L is scattered out of the tub and stored at the bottom of chamber 50, there is no possibility of leaking harmful liquid out of chamber 50. Rings 78 and 80 are made of PVC, screw 82 of polyether ether ketone, and O-ring of synthetic rubber.

In the sealing structure for the connecting portion of cleaning tub 16, as shown in FIG. 7, an annular groove is formed in quartz glass pipe 86 connected with the cleaning tub as one body. C-ring 88 is engaged in this groove, and nut 90 is tightened by C-ring 88 so as not to fall down, and moreover joint 92 into which liquid supplying pipe 42 is inserted is screwed with nut 90. O-ring 84 is provided at an annular groove formed at the inner peripheral surface of joint 92. Glass tube 86 and joint 92 are fluid-supplying sealed by this O-ring 84. Therefore, there is no possibility that cleaning liquid L leaks out of this connecting portion. C ring 88, nut 90, and joint 92 are made of PFA.

As shown in FIGS. 3 and 4, flow direction adjusting plate 94 is provided above cleaning tub 16 so as to cover the space between tub 16 and chamber 50. Adjusting plate 94 is disposed on the inside wall of chamber 50 and inclines downward toward the inside wall of chamber 50. In a proper portion of adjusting plate 94 near chamber 50, hole 96 for exhausting the liquid is formed, as shown in FIG. 5. It is preferable that the distance between the top surface of the fringe of cleaning tub 16 and adjusting plate 94 is set at 10-100 mm in the vertical direction. In the present embodiment, the distance is set at 30 mm.

Punched plate 98 is provided at the lower portion of chamber 50 for rectifying the flow of clean air A. Clean air A is sucked uniformly from the entire horizontal surface of the bottom of chamber 50 through this punched plate 98. In the present embodiment, there are a number of small holes each with a diameter of 10 mm, at its opening ratio of 10%. It is preferable that the diameter of each small hole is set at 5-20 mm.

On the bottom wall of chamber 50, waste water pipe 100 to eject cleaning liquid, etc. remaining at the bottom of chamber 50 is installed. Moreover, drainage-introducing pipe 102 is connected to waste pipe 100. Mist-phase cleaning liquid contained in clean air A exhausted through the exhaust duct 56 is trapped, and resultant drainage is introduced into waste pipe 100 through introducing pipe 102. This waste pipe 100 is used for exhausting the cleaning liquid overflown from cleaning tub 16 or exhausting water with which the inside of chamber 50 has been washed.

Duct 56 is connected to a butterfly-type exhaust pressure controller (not shown) with differential pressure gauge 104 interposed therebetween. In this embodiment, differential pressure gauge 104 is electrically connected to supplying air fan 54, with fan controller 106 for controlling the amount of wind interposed. Therefore, a differential pressure signal detected by differential pressure gauge 104 is input in fan controller 106. A control signal is output to supplying air fan 54 from fan controller 106 in order to always maintain the pressure of −5 to −10 mm H$_2$O in chamber 50 with respect to the outer air. The speed of exhausting air is adjusted to 0.2 to 0.5 m/s.

The function of the cleaning device relating to the first embodiment will now be described.

Air blown from supplying air fan 54 is cleaned through ULPA filter 52, and laminer-flow clean air A is flowed from the top portion of chamber 50. On the other hand, clean air A is exhausted out of chamber 50 from exhaust duct 56 of the bottom portion of chamber 50 by means of an exhaust fan. In chamber 50, clean air A is flowed down. The surrounding portion of cleaning tub 16 is protected by the downflow of clean air A, and adhesion of foreign materials or impurities to the semiconductor wafer can be reduced, so that the yield of the semiconductor product is increased.

Further, the cleaning liquid etc. remaining at the bottom of chamber 50 is exhausted through waste pipe 100 soon, and cleaning liquid L in cleaning tub 16 is always kept clean as being purified by filter 70 and circulated; therefore, the inside of chamber 50 is kept clean. Moreover, in chamber 50, since the downflow of clean air A is always flowed and maintained at negative pressure, atmosphere of the inside of chamber 50 is difficult to leak out and contamination of the outer surrounding resulting from harmful atmosphere can be reduced.

Since flow direction adjusting plate 94 is provided at the upper portion of the outer peripheral surface of cleaning tub 16, if the cleaning liquid is scattered out at the time of taking in/out of the semiconductor wafer, it can be received by adjusting plate 94, so that it is possible to prevent an impurity from entering cleaning tub 16. The cleaning liquid received at the adjusting plate 94 is exhausted downward from hole 96. Moreover, since the flowing passage of the downflow is restricted by plate 94, the flow rate can be raised near cleaning tub 16, so that the steam of the liquid can be sucked and exhausted effectively.

In order to more effectively prevent entering of fine particles, etc. from the outside at the time of opening shutter 60, it is possible to provide an air-curtain on the outside of shutter 60. Moreover, if a number of holes, as well as hole 96, for passing the downflow of clean air A through are formed at the outside portion of adjusting plate 94, i.e. the portion near the inside wall of chamber 50, it is possible to form an advantageous air-curtain also at the inside of shutter 60.

Figure 8:
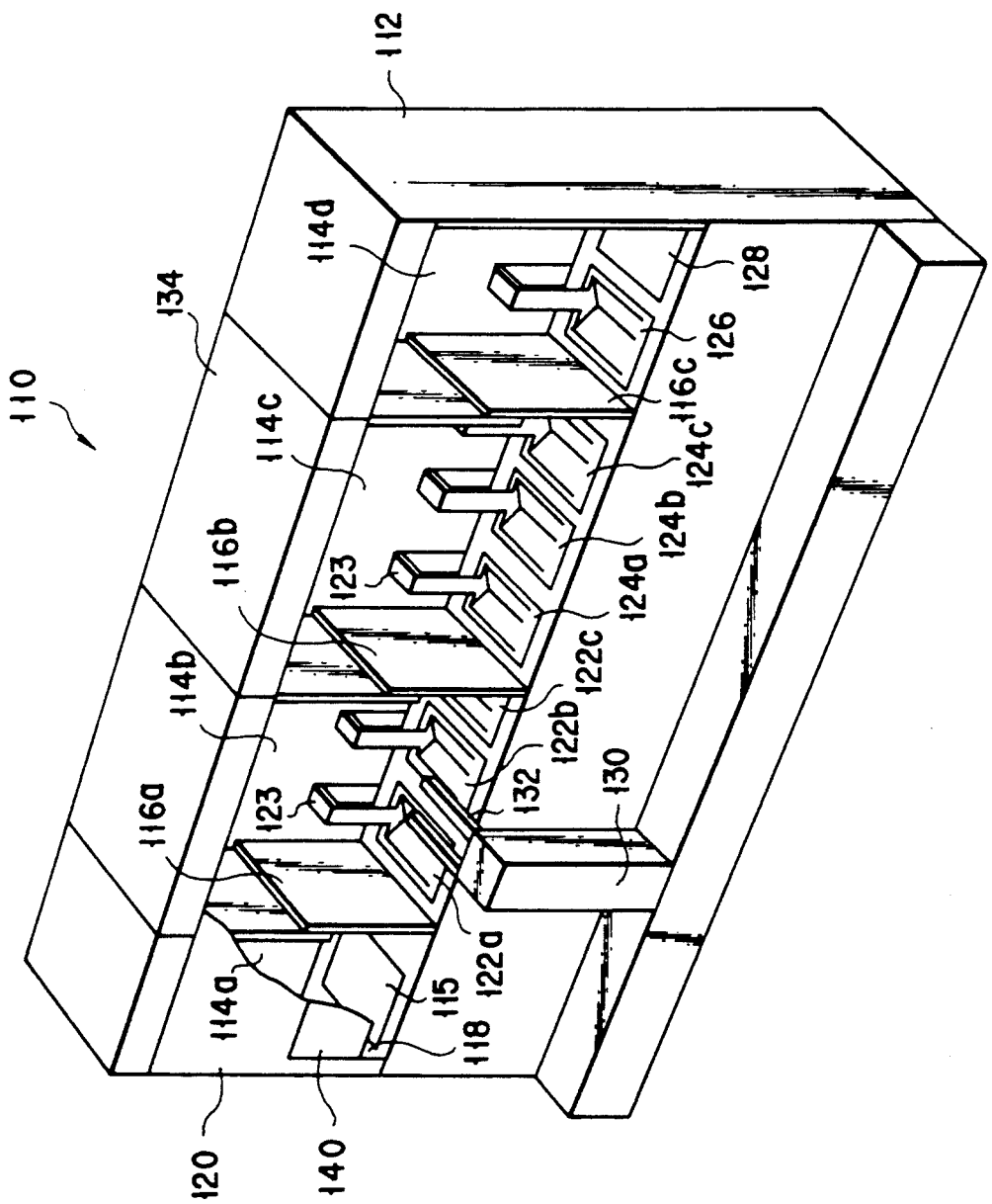
FIG. 8 is a perspective view of a partial section of the cleaning device described in a second embodiment of the present invention.
Figure 9:
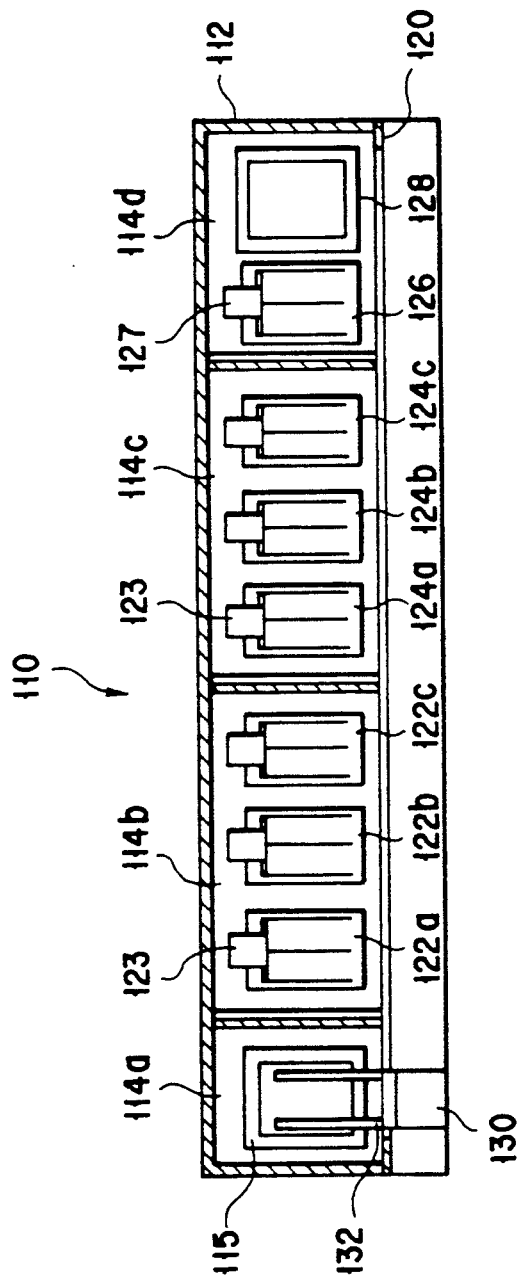
FIG. 9 is a plan view of a partial section of the cleaning device of the second embodiment.

A cleaning device relating to the second embodiment of the present invention will now be described with reference to FIGS. 8 and 9. This cleaning device is a line-type, e.g. cleaning tubs are arranged side by side. The description relating to the same portion a that of the first embodiment will be omitted.

Cleaning device 110 comprises transverse body 112, in which the cleaning chamber is separated into four compartment 114a, 114b, 114c, and 114d by three shutters 116a, 116b, and 116c. The front surface of body 112 is covered with front panel 120 having transverse slit 118 which is formed along the convey passage for conveying a wafer in the chamber.

Robot arm 130 is formed in front of body 112. The arm has two arms 132 which are inserted into the chamber through said slit 118, and shifts horizontally.

The first compartment 114a has loading stage 115 for taking in/out wafers. A wafer holding portion and a wafer lifting mechanism (not shown in the drawings) are provided on this loading stage 115.

The second compartment 114b has three cleaning tubs 122a, 122b, and 122c; the first cleaning tub 122a is used as a chemical process tub in which an ammonia process is performed, and the second and third cleaning tubs 122b and 122c are used as quick dump rinse (QDR) process tubs in which washing is performed. Each tub has elevating mechanism 123 for holding and conveying wafers in/out of the tub.

The third compartment 114c also has three cleaning tubs 124a, 124b, and 124c; the fourth cleaning tub 124a is used as a chemical process tub in which a fluoric acid process is performed, the fifth cleaning tub 124b is used as a washing overflow processing tub, and the sixth cleaning tub 124c is used as a washing final rinse tub. Each tub has elevating mechanism 123 for holding and conveying wafers in/out of the tub.

The fourth compartment 114d has drying tub 126 and unloading stage 128. In drying stage 126, wafer holding mechanism 127 is provided, and in unloading stage 128, like loading stage 115, an wafer holding portion and an wafer lifting mechanism (not shown) are provided.

In the cleaning device disclosed in the present embodiment having such a structure as described above, the following processes are performed: about 50 pieces of semiconductor wafers are conveyed in loading stage 115 by a loading robot (not shown in the drawings), the first shutter 116a is opened, the wafers are conveyed from loading stage 115 to the first cleaning tub 122a, and thereafter the shutter 116a is closed. After an alkali cleaning process, the wafers are conveyed orderly to, and cleaned in, the second cleaning tub 122b and the third cleaning tub 122c.

Thereafter, a second shutter 116b is opened, the wafers are conveyed to the fourth cleaning tub 124a by robot arm 130, and the shutter 116b is closed. After an acid cleaning process, the wafers are washed in the fifth and sixth cleaning tubs 124b and 124c. Finally, the wafers are conveyed to drying tub 126 in the same manner as the above second and third compartments.

After wafers 20 are dried in drying tub 126, the wafers are conveyed to unloading stage 128, and taken out by an unloading robot (not shown).

In the cleaning device of this embodiment, filter unit 134 having an air-supplying fan is provided on the upper portion of each compartment, and the downflow is formed in each of the compartments. Moreover, the same exhaust duct (not shown) as disclosed in the first embodiment is provided on the lower portion of each compartment. Therefore, in each compartment, elimination of fine particles and suction or exhaustion of vapor of chemicals is performed.

Opening/closing door 140 is provided on the front surface of each of compartments 114a and 114d having loading stage 115 and unloading stage 128 and it is opened/closed when the wafers are taken in/out.

As stated above, the compartments are separated by shutters 116a, 116b, and 116c. When conveying arm 130 horizontally moves between the compartments, the shutter by which the compartments are separated is opened, and the shutter is closed after arm 132 holding wafers 20 has passed through. Therefore, it is possible to suppress inflow of atmosphere of one compartment to another compartment.

As the above first and second embodiments, carrier-less conveying and cleaning device of a semiconductor wafer has been described. The present invention can also be applicable to a cleaning device using a carrier.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A cleaning device comprising:
   at least one cleaning tub storing a cleaning liquid;
   a chamber housing said cleaning tub;
   take-in/take-out means for taking an article to be cleaned in/out of the cleaning liquid in said cleaning tub;
   a shutter for shutting out the inside of said chamber from the outside thereof, said shutter opening at the time of conveying said article in/out of said chamber, thereby passing said article therethrough;
   clean air supplying means for supplying clean air in said chamber and forming downflow of the clean air around said cleaning tub; and
   exhausting means for sucking the clean air passing around said cleaning tub and exhausting it out of said chamber;
   the cleaning device further comprising means for increasing the speed of the downflow passing around the peripheral portion of an upper surface of said cleaning tub.

2. The cleaning device according to claim 1 further comprising:
   means for filtering the cleaning liquid in said cleaning tub and circulating the cleaning liquid; and
   means for exhausting the cleaning liquid leaking in said chamber.

3. The cleaning device according to claim 1, wherein said exhausting means includes a punched plate disposed at the bottom of said chamber.

4. The cleaning device according to claim 3, wherein said punched plate has a number of holes each having a diameter of 5 to 20 mm.

5. The cleaning device according to claim 4 wherein said punched plate has a number of holes each having a diameter of 10 mm, whose opening ratio is 10%.

6. The cleaning device according to claim 1, further including pressure keeping means for maintaining a reduced pressure inside of said chamber relative to a pressure outside of said chamber, said pressure keeping means including detection means for detecting a differential pressure between the inside of said chamber and the outside thereof, and controlling the amount of air in said clean air supplying means.

7. A cleaning device comprising:
   at least one cleaning tub for storing a cleaning liquid;
   p1 a chamber housing said one cleaning tub;
   take-in/take-out means for taking a cleaned material in/out of the cleaning liquid in said cleaning tub;
   a shutter for shutting out the inside of said chamber from the outside, said shutter opening at the time of conveying said cleaned material in/out of said chamber, thereby passing said article there through;
   clean air supplying means for supplying clean air into said chamber and forming downflow of said clean air around said cleaning tub;
   exhausting means for sucking said clean air passing around said cleaning tub and exhausting it out of said chamber; and
   means for increasing the speed of the downflow at the peripheral portion of the upper surface of said cleaning tub, said downflow speed increasing means including a flow direction adjusting plate provided in said chamber so as to cover the peripheral portion of the upper surface of said cleaning tub.

8. The cleaning device according to claim 7, wherein said adjusting plate is arranged so as to form a gap, whose vertical size is 10 to 100 mm, between said plate and the peripheral portion of the upper surface of said cleaning tub.

9. The cleaning device according to claim 8, wherein said adjusting plate is arranged so as to form a gap, whose vertical size is 30 mm, between said plate and the peripheral portion of the upper surface of said cleaning tub.

* * * * *